(12) United States Patent
Wu

(10) Patent No.: US 6,207,999 B1
(45) Date of Patent: Mar. 27, 2001

(54) DOUBLE CODING MASK READ ONLY MEMORY (MASK ROM) FOR MINIMIZING BAND-TO-BAND LEAKAGE

(75) Inventor: Shye-Lin Wu, Hsinchu (TW)

(73) Assignee: Texas Instruments-Acer Incorporated, Hsinchu (TW)

( * ) Notice: Subject to any disclaimer, the term of this patent is extended or adjusted under 35 U.S.C. 154(b) by 0 days.

(21) Appl. No.: 09/238,381

(22) Filed: Jan. 27, 1999

Related U.S. Application Data

(63) Continuation-in-part of application No. 09/072,291, filed on May 4, 1998.

(51) Int. Cl.[7] .......................... H01L 29/76; H01L 29/94; H01L 31/062; H01L 31/113; H01L 31/119
(52) U.S. Cl. .......................... 257/390; 257/391; 257/336; 257/344; 257/324; 257/192; 257/194
(58) Field of Search ................................ 257/390, 391, 257/408, 324, 336, 344, 192, 194, 196

(56) References Cited

U.S. PATENT DOCUMENTS

| | | | |
|---|---|---|---|
| 5,081,052 | * | 1/1992 | Kobayashi et al. ............. 437/29 |
| 5,200,802 | * | 4/1993 | Miller ............................ 257/390 |
| 5,397,908 | * | 3/1995 | Dennison et al. ............... 257/306 |
| 5,536,962 | * | 7/1996 | Pfiester ......................... 257/392 |
| 5,793,086 | * | 8/1998 | Ghio et al. ..................... 257/390 |
| 6,037,615 | * | 3/2000 | Matsuyama et al. ........... 257/192 |

* cited by examiner

Primary Examiner—Sheila V. Clark
Assistant Examiner—Jesse A. Fenty
(74) Attorney, Agent, or Firm—Harness, Dickey & Pierce, P.L.C.

(57) ABSTRACT

The present invention provides a mask ROM memory to minimize band-to-band leakage. The substrate includes a normal NMOS device region and a NMOS cell region for coding. An isolation region is formed between the normal NMOS device region and the NMOS cell region. A gate oxide layer is formed on the normal NMOS device region and a coding oxide layer is formed on the NMOS cell region, respectively. In the preferred embodiments, the coding oxide layer has a thickness of about two to ten times that of the gate oxide layer. Main gates are respectively formed on the gate oxide layer and the coding oxide layer. In the present invention, the main gates comprise materials like metal and metal compounds. Spacers are formed on the side walls of the main gates. First doped regions of source and drain regions, or namely lightly doped drains (LDD) and sources, are formed under the spacers and are adjacent to the main gates. Second doped regions of the source and drain regions are formed next to and outside the first doped regions. The second doped regions have a heavier dose than the first doped regions. A p type doped region is formed under the coding oxide layer and adjacent to a surface of the NMOS cell region. The p type doped region is doped with dopants like aluminum-containing, gallium-containing, indium-containing, or thallium-containing dopants. The p type doped region has higher resistance than the other normal NMOS devices during the operation.

19 Claims, 6 Drawing Sheets

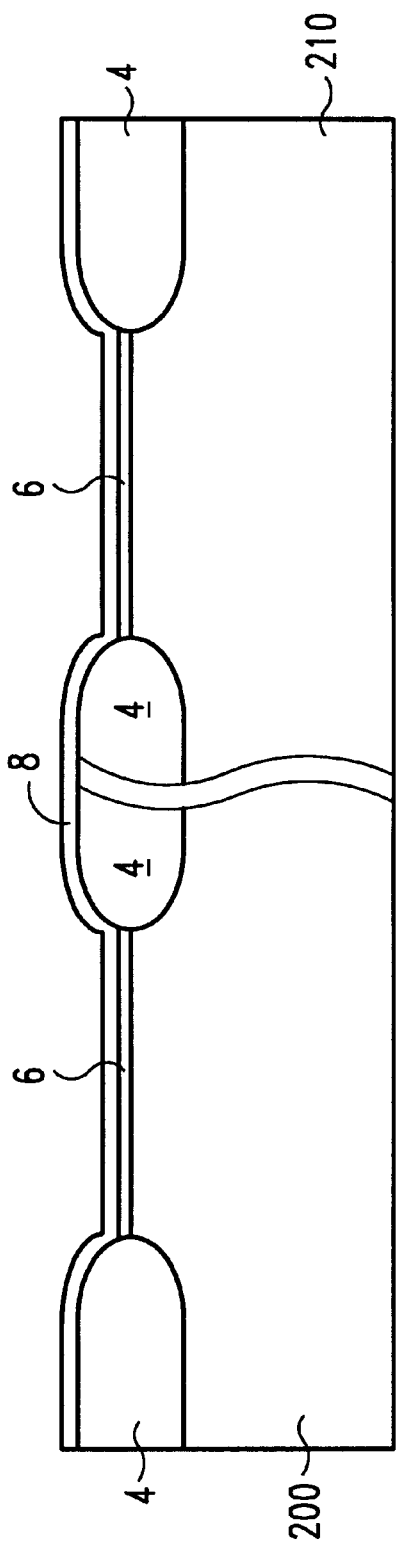

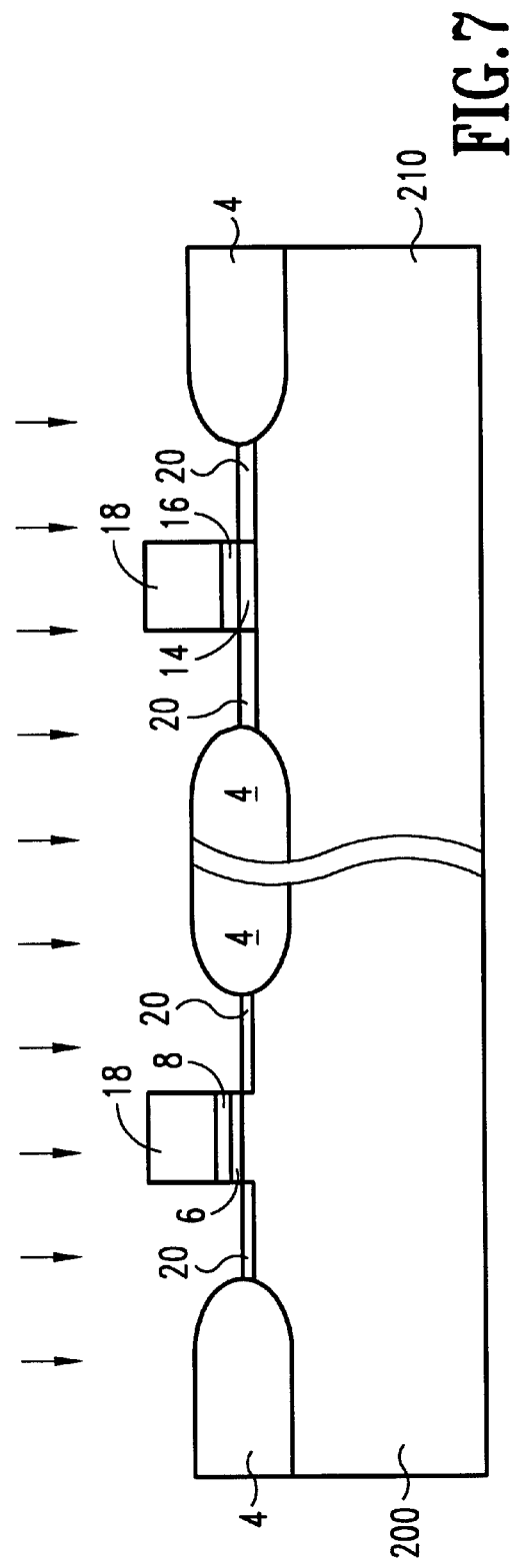
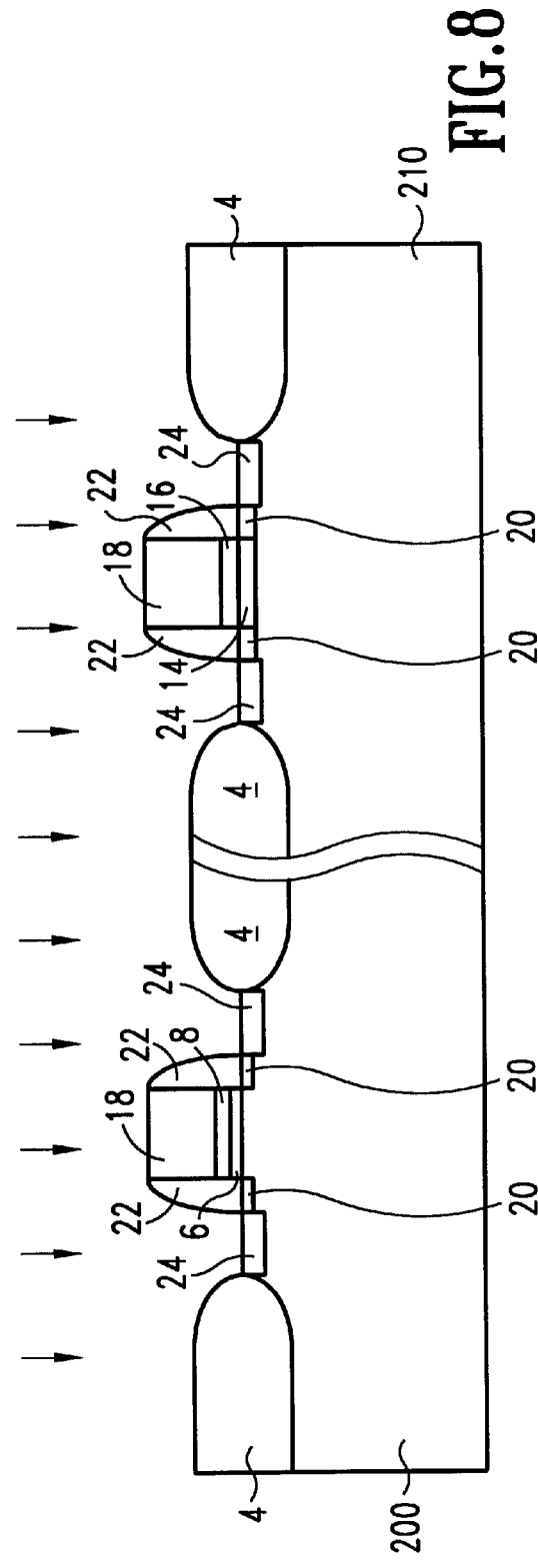

DOUBLE CODING MASK READ ONLY MEMORY (MASK ROM) FOR MINIMIZING BAND-TO-BAND LEAKAGE

CROSS REFERENCE TO RELATED APPLICATIONS

This invention is a continuation-in-part application of an application filed with a Ser. No. 09/072,291, filed May 4, 1998, under the same title and assigned to same assignee with the same inventor as the present application.

FIELD OF THE INVENTION

The present invention relates to semiconductor devices, specifically to semiconductor memories and more specifically to a structure of mask read only memories for minimizing band-to-band leakage.

BACKGROUND

Memory devices are driven by new applications and requirements of the future. Advance in the fields of computer and communications will demand large quantities of various species of memories. For example, computer interfaces will hopefully be operated by speech processing or visual processing. Great capacity and processing speed are required for such audio and video signal processing. Besides, other kinds of communication applications and interfaces also require a lot of memory. Memory technology will continue to move in the direction of increased numbers of devices in a wafer.

Read only memory (ROM) are devices which include ROM cells for coding data and a periphery controlling devices to control the operation of the cells. In read only memories, each bit of data is stored in a cell, like a single n-channel transistor or ROM cell. As is well known in the art, the programming of the ROM is executed by controlling a threshold voltage of the MOS transistor by the implantation of dopant to construct the memory cell with the desired coding status.

In general, the mask ROM includes different types of devices with different threshold voltages. A type of device is formed in one active area and another type of device with a threshold voltage mask is formed in another active area during the process. In MOS transistors for mask ROM, the threshold voltages of the channel regions under the gates are set to the same value before data writing. Thereafter, ions are selectively implanted into determined regions to change the threshold voltages thereof for data writing. One of the methods for adjusting the threshold voltage is achieved by ion implantation to some of the transistor gates. This method raises the threshold voltage of the n-channel device by doping boron with a heavy dose. The prior arts relating to the ROM can be seen in U.S. Pat. No. 5,372,961 and U.S. Pat. No. 5,538,906 disclosed by Noda and Aoki, respectively. The process of ion implantation having high dose boron through the sacrifice oxide or the polysilicon gate into the substrate is widely used to fabricate the normally off mask ROM devices.

However, the high dose boron implantation results in a lower junction breakdown voltage of the coded MOS and also a very high leakage current between the adjacent bit lines. As mentioned in a U.S. Pat. No. 5,597,753 disclosed by Sheu, the high leakage current results in very high standby current. Another problem occurs with the ROM code implantation. As what is well-known in the art, after the coding implantation is carried out, a thermal process is used to activate the implanted dopants. The process can cause counter doping of the adjacent bit lines, thereby increasing the bit line resistance and substantially degrading the performance of the ROM devices. One prior art method to reduce the bit line resistance is disclosed by Hong in U.S. Pat. No. 5,571,739.

SUMMARY

The object of the present invention is to provide a mask ROM memory to minimize the band-to-band leakage. The substrate includes a normal NMOS device region and a NMOS cell region for coding. An isolation region is formed between the normal NMOS device region and the NMOS cell region. A gate oxide layer is formed on the normal NMOS device region and a coding oxide layer is formed on the NMOS cell region, respectively. In the preferred embodiments, the coding oxide layer has a thickness of about two to ten times of that of the gate oxide layer. Main gates are respectively formed on the gate oxide layer and the coding oxide layer. In the present invention, the main gates comprise materials like metal and metal compounds. Spacers are formed on the side walls of the main gates. First doped regions of source and drain regions, or namely lightly doped drains (LDD) and sources, are formed under the spacers and adjacent to the main gates. Second doped regions of the source and drain regions are formed next to and outside the first doped regions. The second doped regions have a heavier dose than the first doped regions. A p type doped region is formed under the coding oxide layer and in adjacent to a surface of the NMOS cell region. The p type doped region is doped with dopants like aluminum-containing, gallium-containing, indium-containing, or thallium-containing dopants. The p type doped region has higher resistance than the other normal NMOS devices during the operation. In addition, the mask ROM can further includes a polysilicon layer formed between the gate oxide layer and at least one of the main gates on the NMOS device region.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1 is a cross-sectional view of a semiconductor substrate illustrating the steps of forming a gate oxide layer and a polysilicon layer on the substrate according to the present invention.

FIG. 2 is a cross-sectional view of a semiconductor substrate illustrating the step of forming a silicon nitride layer over the substrate according to the present invention.

FIG. 7 is a cross-sectional view of a semiconductor substrate illustrating the step of performing a second ion implantation according to the present invention.

FIG. 8 is a cross-sectional view of a semiconductor substrate illustrating the steps of forming spacers and performing a third ion implantation according to the present invention.

DETAILED DESCRIPTION

Figure 9:
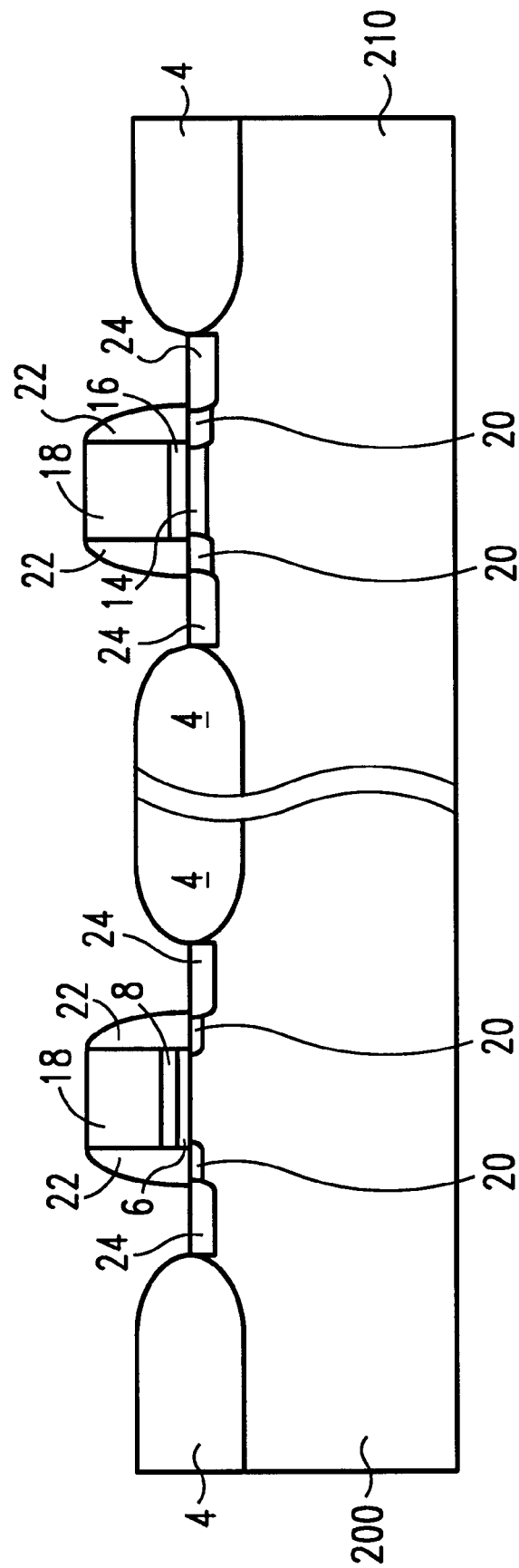
FIG. 9 is a cross-sectional view of a semiconductor substrate illustrating the step of performing a thermal oxidation to activate the dopant according to the present invention.

The present invention proposes mask ROM devices and a method with double coding processes to fabricate the normally off mask ROM devices. With the processes according to the present invention, the disadvantage mentioned in the background will be eliminated. The high dose coding implant induced counter doping of the adjacent bit lines can be minimized. The detailed description can be seen as follows. Turning to FIG. 9, the substrate includes a normal NMOS device region 200 and a NMOS cell region 210 for coding. An isolation structure 4 is formed between the normal NMOS device region 200 and the NMOS cell region 210. A gate oxide layer 6 is formed on the normal NMOS device region 200 and a coding oxide layer 16 is formed on the NMOS cell region 210, respectively. In the preferred embodiments, the coding oxide layer 16 has a thickness of about two to ten times of that of the gate oxide layer 6.

Next, main gates 18 are respectively formed on the gate oxide layer 6 and the coding oxide layer 16. In the present invention, the main gates 18 comprise materials like metal and metal compounds. Spacers 22 are formed on the side walls of the main gates 18. First doped regions of source and drain regions 20, or namely lightly doped drains (LDD) and sources, are formed under the spacers and adjacent to the main gates 18. Second doped regions 24 of the source and drain regions are formed next to and outside the first doped regions 20. The second doped regions 24 have a heavier dose than the first doped regions 20. A p type doped region 14 is formed under the coding oxide layer 16 and in adjacent to a surface of the NMOS cell region 210. The p type doped region 14 is doped with dopants like aluminum-containing, gallium-containing, indium-containing, or thallium-containing dopants. The p type doped region 14 has higher resistance than the other normal NMOS devices during the operation.

In addition, the mask ROM can further includes a polysilicon layer 8 formed between the gate oxide layer 6 and at least one of the main gates 18 on the NMOS device region 200. The p type doped region can have a dopant concentration of about 5E11 to 1E15 atoms/cm$^3$. The material of the main gates in the case can be conductive materials like aluminum (Al), titanium (Ti), tungsten (W), tantalum (Ta), nickel (Ni), palladium (Pd), platinum (Pt), cobalt (Co), molybdenum (Mo), strontium (Sr), yttrium (Y), ruthenium (Ru), lead (Pb), metal nitride, or metal silicide.

The mask ROM disclosed by the present invention has a much thicker coding oxide layer than the gate oxide layer. Furthermore, the coding implant for the mask ROM according to the present invention is performed with low dose implantation of aluminum-containing, gallium-containing, indium-containing, or thallium-containing dopants. The thickness of the coding oxide layer 16 is about 200 to 1000 angstroms. The low dose p type doped region 14 reduces the risk of high dose coding implant induced leakage. TABLE 1 shows that the combination of low dose p type implant and thicker coding oxide exhibits a better characteristics for the normally off mask ROM operation.

The method for forming the aforesaid mask ROM will be described as follows. Referring to FIG. 1, a single crystal substrate with a <100> crystallographic orientation is used for the preferred embodiment. The substrate is divided into two major portions that are a normal NMOS device region 200 and a NMOS cell region 210 for coding. In this embodiment, thick field oxide (FOX) regions 4 are created for the purposes of isolation. Typically, the FOX regions 4 are created via a photoresist and dry etching to define a silicon nitride-silicon dioxide composite layer. After the photoresist is removed and a wet clean process is performed, thermal oxidation in an oxygen ambient is performed using the composite layer as a hard mask to form the FOX regions 4, to a thickness of about 3000 to 8000 angstroms. The silicon nitride layer is then typically removed using hot phosphoric acid solution while the silicon dioxide is removed by using diluted HF or BOE solution. Other technology such as trench isolation may be used.

Subsequently, a thin oxide layer 6 is formed both on the normal NMOS device region 200 and the NMOS cell region 210 to act as a gate oxide by using an oxygen-steam ambient, at a temperature of between about 800 to 1100 degrees centigrade. Alternatively, the gate oxide 6 may be formed by using other known oxide chemical compositions and procedures. For example, the gate oxide layer 6 can be silicon dioxide formed using a chemical vapor deposition process, with a tetraethylorthosilicate (TEOS) source, at a temperature of between about 600 to 800 degrees centigrade and a pressure of about 0.1 to 10 torr. In the preferred embodiment, the thickness of the gate oxide layer 6 is about 15–200 angstroms. After the silicon oxide layer 6 is formed a polysilicon layer 8 is deposited by chemical vapor deposition on the gate oxide layer 6.

Turning to FIG. 2, a thin silicon nitride layer 10 is then formed on the polysilicon layer 8. In general, the silicon nitride layer 10 can be deposited by any suitable process such as Low Pressure Chemical Vapor Deposition (LPCVD), Plasma Enhance Chemical Vapor Deposition (PECVD), or Electron Cyclotron Remote Chemical Vapor Deposition (ECRCVD). The thickness of the silicon nitride layer is about 200 to 1500 angstroms. Further, the temperature to form the silicon nitride layer 10 is at a range of about 300–800° C. In the preferred embodiment, the reaction gases for forming the silicon nitride layer 10 are selected from $SiH_4$, $NH_3$, $N_2$, $N_2O$ or $SiH_2Cl_2$, $NH_3$, $N_2$, $N_2O$.

Figure 3:
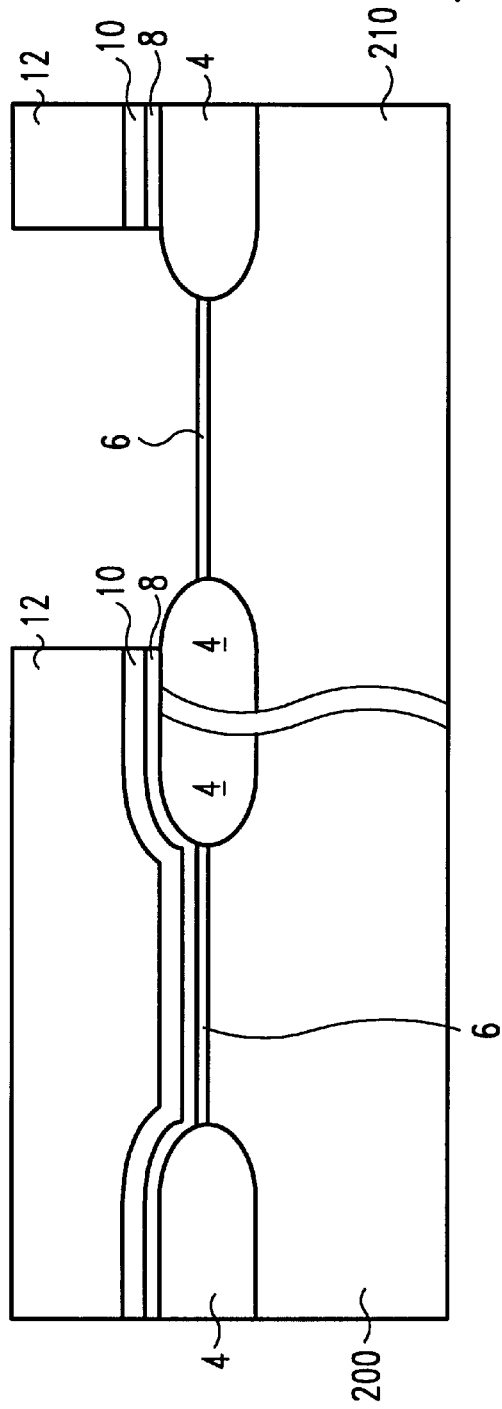
FIG. 3 is a cross-sectional view of a semiconductor substrate illustrating the step of patterning a photoresist on the substrate according to the present invention.

Now referring to FIG. 3, a photoresist 12 is patterned over the normal NMOS device region 200 to expose the NMOS cell region 210 by means of conventional lithography process. Afterwards, an etching is performed using the photoresist 12 as an etching mask to etch back the silicon nitride layer 10 and the polysilicon layer 8 on the NMOS cell region 210. Next, the photoresist 12 is removed by a technology well-known in the art.

Figure 4:
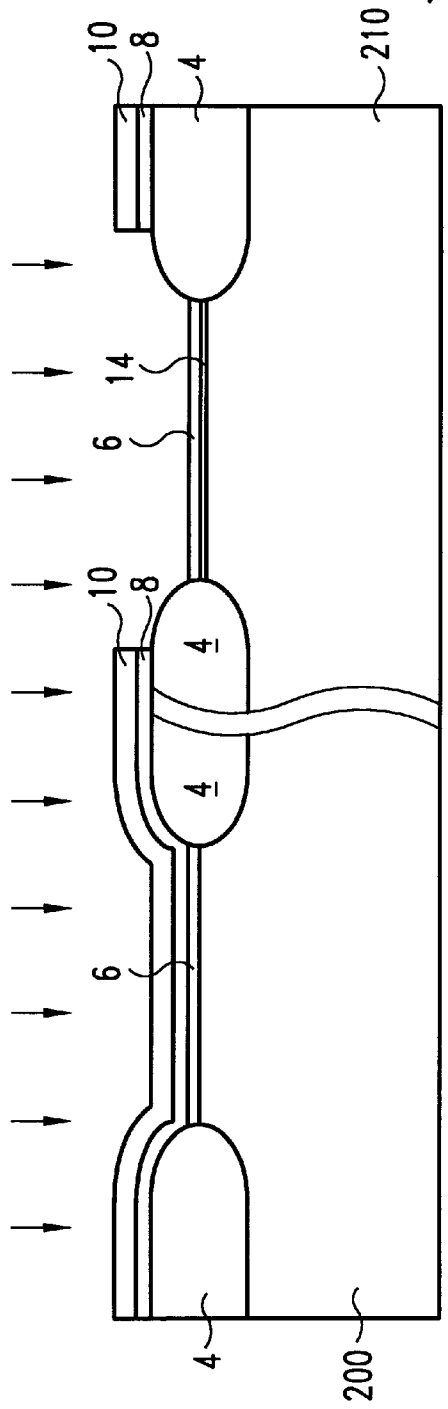
FIG. 4 is a cross-sectional view of a semiconductor substrate illustrating the step of performing a first ion implantation according to the present invention.

Next, a blanket ion implantation with p type dopants such as aluminum-containing, gallium-containing, indium-containing, or thallium-containing dopants is carried out to form p type lightly doped drain region (p type doped region) 14 right under to the surface of the NMOS cell region 210, as shown in FIG. 4. The implantation is performed with low dose to increase the surface p type dopant concentration for coding. Preferably, the energy and dosage of the implantation are about 0.5 to 150 KeV and 5E11 to 1E15 atoms/cm$^2$, respectively.

Figure 5:
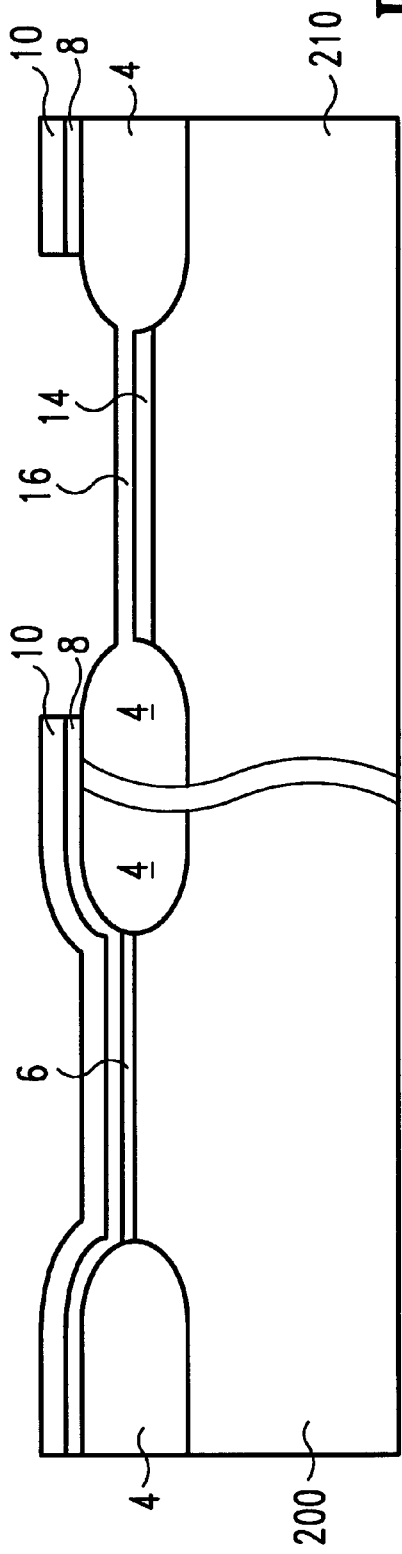
FIG. 5 is a cross-sectional view of a semiconductor substrate illustrating the step of forming a coding oxide layer over the substrate according to the present invention.
Figure 6:
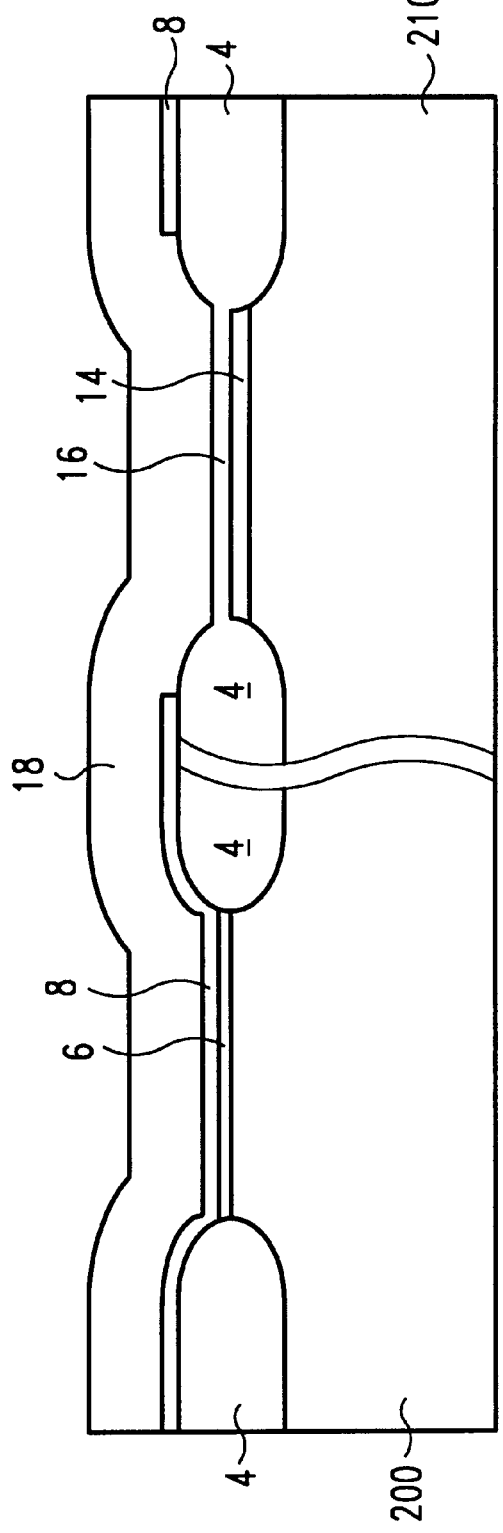
FIG. 6 is a cross-sectional view of a semiconductor substrate illustrating the step of forming main gates on the substrate according to the present invention.

Turning to FIG. 5, a coding oxide layer 16 is formed on the NMOS cell region 210 by a thermal oxidation in an ambient containing oxygen. The silicon nitride layer 10 serves as a hard mask during the oxidation. The temperature for the thermal oxidation is about 750 to 1100 degrees centigrade. In the preferred embodiment, the thickness of the coding oxide layer 16 is about two to ten times that of the thickness of the gate oxide layer 6, or about 200 to 1000 angstroms in this case. Then, the silicon nitride layer 10 is stripped by wet etching such as by use of a hot phosphorus solution. A conductive layer 18 for forming main gates and word lines is deposited over both the normally NMOS device region 210 and the NMOS cell region 210, as shown in FIG. 6. In this step, the second polysilicon layer 18 is used to act as a word line. The material of the conductive layer 18 in this case can be metal or metal compounds, or namely materials like aluminum (Al), titanium (Ti), tungsten (W), tantalum (Ta), nickel (Ni), palladium (Pd), platinum (Pt), cobalt (Co), molybdenum (Mo), strontium (Sr), yttrium (Y), ruthenium (Ru), lead (Pb), metal nitride, or metal silicide. The metal or metal compound can be deposited with a chemical vapor deposition (CVD) process. A sputtering process can be used alternatively to deposit the metals or metal compound. By employing a metal or metal compound material as the main material of the gate structure, the conductivity of the gate and the operational characteristics of the transistor device can be enhanced.

Referring to FIG. 7, the polysilicon layer 8, the conductive layer 18, the gate oxide layer 6 and the coding oxide layer 16 are patterned to form the gate structures on the aforementioned normally NMOS device region 200 and the NMOS cell region 210, respectively. A second ion implantation with n conductive type dopant is used to implant ions into the NMOS device region 200 and the NMOS cell region 210 by using the gate structures as a mask, thereby forming n type LDD regions 20 adjacent to the gate structures. Preferably, the dopant for the second ion implantation is phosphorus or arsenic-containing dopants and the implantation is performed with low dosage. The energy and dosage of the implantation are about 5 to 100 KeV and 1E12 to 1E14 atoms/cm$^2$, respectively.

Referring to FIG. 8, a silicon oxide layer is deposited by means of chemical vapor deposition on the gate structures. Sidewall spacers 22 are then formed on the side walls of the gate structures by an anisotropic etching back of the silicon oxide layer. Next, a third ion implantation is then carried out to dope ions into the substrate. In the preferred embodiment, the step is employed with high dose n conductive type ions, such as arsenic or phosphorus-containing dopants. After the procedure, n conductive type source and drain regions 24 are formed adjacent the gate structure in the NMOS device region 200 and the NMOS cell region 210, respectively. It has to be noted that the concentration of the NMOS cell will be lower than the one of the normal NMOS device due to the first ion implantation being introduced with p type doped dopants. The NMOS cell region 210 exhibits high resistance. Thus, the threshold voltage of the NMOS cell region 210 will be much higher than that of the normal device in the NMOS device region 200. The energy and dosage of the forth implantation are about 0.5 to 80 KeV and 5E14 to 5E16 atoms/cm$^2$, respectively.

Turning to FIG. 9, a high temperature thermal anneal is performed in an ambient containing a gas that is selected from the group of $N_2$, $O_2$, and $N_2O$ to activate the dopant and therefore form a shallow junction of the devices. In such case, the temperature for this step can range from 800 to 1100 degrees centigrade.

TABLE 1 compares the threshold voltage of various coding processes. The coding implant is performed with the aforementioned p type dopants by using an energy of 100 KeV through a pad oxide having 250 angstroms in thickness.

TABLE 1

| sample | coding implant (atoms/cm$^2$) | coding oxide (angstrom) | threshold voltage (V) |
|---|---|---|---|
| A | No | No | 0.69 |
| B | 1E14 | No | 2.81 |
| C | 1E14 | 300 | 7.41 |
| D | No | 300 | 1.84 |
| E | 5E14 | No | 3.95 |
| F | 5E13 | 300 | 6.16 |

Figure 10:
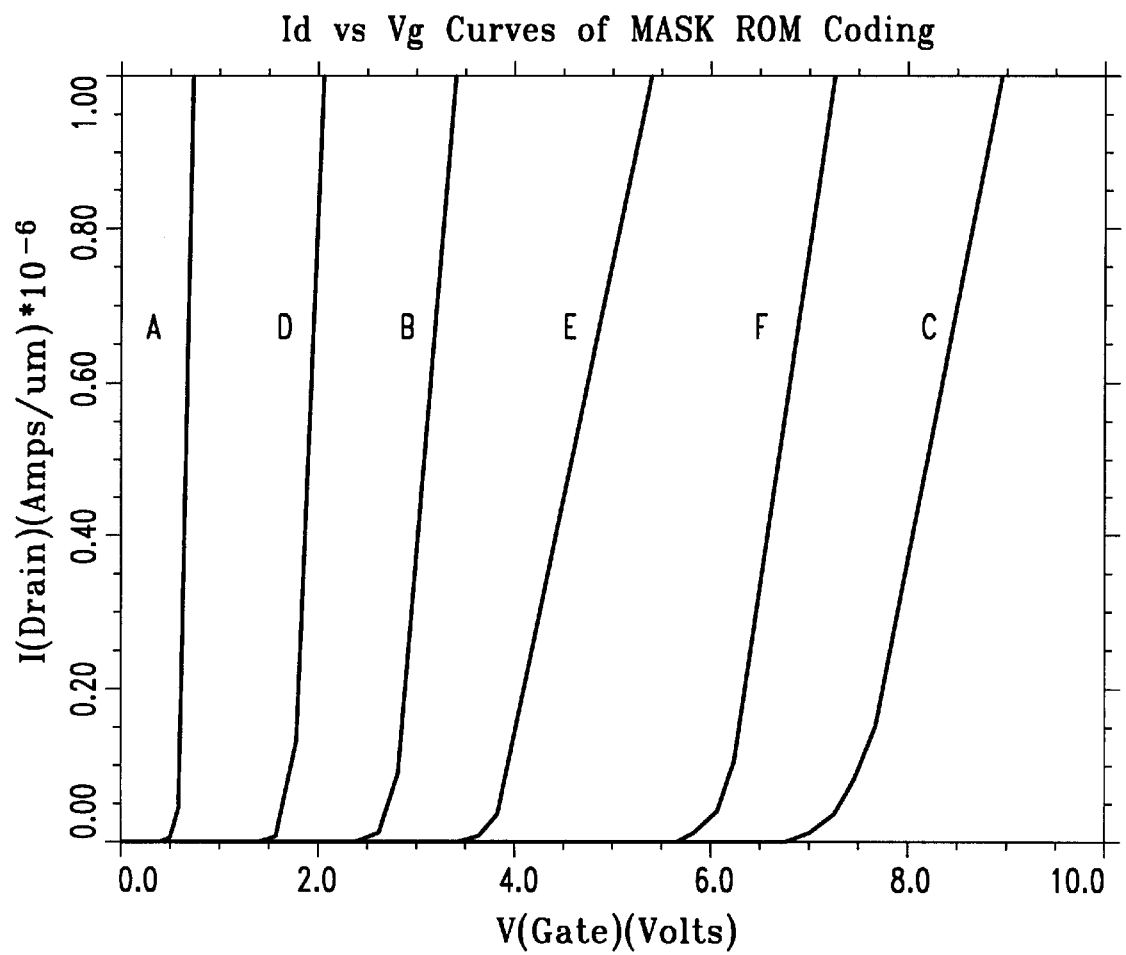
FIG. 10 shows the Id versus Vg curves of difference coding conditions.

FIG. 10 shows the Id versus Vg curves of difference coding conditions. It can be seen that the combination of low dose boron implant and thicker gate oxide film demonstrates a better candidate for the normally off mask ROM operation. As can be appreciated from the above disclosure, the present invention provides the following advantages: (1) The high dose coding implant induced a lower junction breakdown and a higher leakage current of the coded NMOS device can be avoided by using a low dose boron or $BF_2$ coding implant. (2) the high dose coding implant induced counter doping of the adjacent bit lines can be minimized; (3) the gate oxide thickness of the proposed coded NMOS devices is much thinner than that of the thick oxide coded NMOS cell.

As is understood by a person skilled in the art, the foregoing embodiments of the present invention are illustrative of the present invention rather than limiting of the present invention. They are intended to cover various modifications and similar arrangements included within the spirit and scope of the appended claims, the scope of which should be accorded the broadest interpretation so as to encompass all such modifications and similar structures. Accordingly, while the preferred embodiment of the invention has been illustrated and described, it will be appreciated that various changes can be made therein without departing from the spirit and scope of the invention.

What is claimed is:

1. A mask ROM (mask read only memory) device on a substrate having a NMOS device region and a NMOS cell region for coding, said mask ROM comprising:

an isolation structure formed between said NMOS device region and said NMOS cell region;

a gate oxide layer formed on said NMOS device region;

a coding oxide layer formed on said NMOS cell region, said coding oxide layer having a thickness of about two to ten times of a thickness of said gate oxide layer;

main gates respectively formed on said gate oxide layer and said coding oxide layer, said main gates comprising a material being selected from the group consisting of metal and metal compounds;

sidewall spacers formed on side walls of said main gates;

first doped regions of source and drain regions formed under said sidewall spacers and adjacent to said main gates;

second doped regions of said source and drain regions forming next to and outside said first doped regions, said second doped regions having a heavier dose than said first doped regions; and a p type doped region formed under said coding oxide layer and in adjacent to a surface of said NMOS cell region, said p type doped region being doped with dopants selected from the group consisting of aluminum-containing, gallium-containing, indium-containing, and thallium-containing dopants.

2. The mask ROM of claim 1 further comprises a polysilicon layer formed between said gate oxide layer and at least one of said main gates on said NMOS device region.

3. The mask ROM of claim 1, wherein said p type doped region has a dopant concentration of about 5E11 to 1E15 atoms/cm3.

4. The mask ROM of claim 1, wherein dopants of said first doped regions are selected from the group of arsenic-containing and phosphorus-containing dopants.

5. The mask ROM of claim 1, wherein dopants of said second doped regions are selected from the group of arsenic-containing and phosphorus-containing dopants.

6. The mask ROM of claim 1, wherein said isolation structure includes a field oxide region.

7. The mask ROM of claim 1, wherein said gate oxide layer includes silicon oxide.

8. The mask ROM of claim 1, wherein the coding oxide layer includes silicon oxide.

9. The mask ROM of claim 1, wherein the material of said main gates is selecting from the group consisting of aluminum (Al), titanium (Ti), tungsten (W), tantalum (Ta), nickel (Ni), palladium (Pd), platinum (Pt), cobalt (Co), molybdenum (Mo), strontium (Sr), yttrium (Y), ruthenium (Ru), lead (Pb), metal nitride, and metal silicide.

10. The mask ROM of claim 1, wherein said sidewall spacers are silicon oxide sidewall spacers.

11. A mask ROM (mask read only memory) device on a substrate having a NMOS device region and a NMOS cell region for coding, said mask ROM comprising:

an isolation structure formed between said NMOS device region and said NMOS cell region;

a gate oxide layer formed on said NMOS device region;

a coding oxide layer formed on said NMOS cell region, said coding oxide layer having a thickness of about two to ten times of a thickness of said gate oxide layer;

main gates respectively formed on said gate oxide layer and said coding oxide layer, said main gates comprising a material being selected from the group consisting of metal and metal compounds;

a polysilicon layer between said gate oxide layer and at least one of said main gates on said NMOS device region;

sidewall spacers formed on side walls of said main gates;

first doped regions of source and drain regions formed under said sidewall spacers and adjacent to said main gates;

second doped regions of said source and drain regions forming next to and outside said first doped regions, said second doped regions having a heavier dose than said first doped regions; and a p type doped region formed under said coding oxide layer and in adjacent to a surface of said NMOS cell region, said p type doped region being doped with dopants selected from the group consisting of aluminum-containing, gallium-containing, indium-containing, and thallium-containing dopants, said p type doped region having a dopant concentration of about 5E11 to 1E15 atoms/cm3.

12. The mask ROM of claim 11, wherein dopants of said first doped regions are selected from the group of arsenic-containing and phosphorus-containing dopants.

13. The mask ROM of claim 11, wherein dopants of said second doped regions are selected from the group of arsenic-containing and phosphorus-containing dopants.

14. The mask ROM of claim 11, wherein said isolation structure includes a field oxide region.

15. The mask ROM of claim 11, wherein said gate oxide layer includes silicon oxide.

16. The mask ROM of claim 11, wherein the coding oxide layer includes silicon oxide.

17. The mask ROM of claim 11, wherein the material of said main gates is selecting from the group consisting of aluminum (Al), titanium (Ti), tungsten (W), tantalum (Ta), nickel (Ni), palladium (Pd), platinum (Pt), cobalt (Co), molybdenum (Mo), strontium (Sr), yttrium (Y), ruthenium (Ru), lead (Pb), metal nitride, and metal silicide.

18. The mask ROM of claim 11, wherein said sidewall spacers are silicon oxide sidewall spacers.

19. The mask ROM of claim 11, wherein said thickness of said coding oxide layer is about 200 to 1000 angstroms, and said thickness of said gate oxide layer is about 15 to 200 angstroms.

* * * * *